(12) United States Patent
Ahn et al.

(10) Patent No.: US 9,252,281 B2
(45) Date of Patent: *Feb. 2, 2016

(54) SILICON ON GERMANIUM

(71) Applicant: Micron Technology, Inc., Boise, ID (US)

(72) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,187

(22) Filed: May 28, 2014

(65) Prior Publication Data

US 2014/0264555 A1 Sep. 18, 2014

Related U.S. Application Data

(60) Continuation of application No. 13/617,211, filed on Sep. 14, 2012, now Pat. No. 8,741,746, which is a continuation of application No. 12/829,099, filed on Jul. 1, 2010, now Pat. No. 8,269,254, which is a division of application No. 11/498,576, filed on Aug. 3, 2006, now Pat. No. 7,749,879.

(51) Int. Cl.
*H01L 29/786* (2006.01)
*H01L 21/28* (2006.01)
*H01L 29/51* (2006.01)

(52) U.S. Cl.
CPC .... *H01L 29/78651* (2013.01); *H01L 21/28255* (2013.01); *H01L 29/517* (2013.01); *H01L 29/513* (2013.01)

(58) Field of Classification Search
CPC ..... H01L 29/786; H01L 29/788; H01L 29/51; H01L 29/00; H01L 23/58
USPC .......................... 257/327, 666, 616, 613, 314
See application file for complete search history.

(56) References Cited

U.S. PATENT DOCUMENTS

| | | | |
|---|---|---|---|
| 6,063,705 | A | 5/2000 | Vaartstra |
| 6,495,436 | B2 | 12/2002 | Ahn et al. |
| 6,514,828 | B2 | 2/2003 | Ahn et al. |
| 6,534,420 | B2 | 3/2003 | Ahn et al. |
| 6,607,948 | B1 | 8/2003 | Sugiyama et al. |
| 6,767,795 | B2 | 7/2004 | Ahn et al. |

(Continued)

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.

(Continued)

*Primary Examiner* — Chuong A Luu
(74) *Attorney, Agent, or Firm* — Schwegman Lundberg & Woessner, P.A.

(57) ABSTRACT

A monolayer or partial monolayer sequencing processing, such as atomic layer deposition (ALD), can be used to form a semiconductor structure of a silicon film on a germanium substrate. Such structures may be useful in high performance electronic devices. A structure may be formed by deposition of a thin silicon layer on a germanium substrate surface, forming a hafnium oxide dielectric layer, and forming a tantalum nitride electrode. The properties of the dielectric may be varied by replacing the hafnium oxide with another dielectric such as zirconium oxide or titanium oxide.

20 Claims, 4 Drawing Sheets

(56) References Cited

U.S. PATENT DOCUMENTS

| | | | |
|---|---|---|---|
| 6,844,203 B2 | 1/2005 | Ahn et al. | |
| 6,893,984 B2 | 5/2005 | Ahn et al. | |
| 6,900,122 B2 | 5/2005 | Ahn et al. | |
| 6,921,702 B2 | 7/2005 | Ahn et al. | |
| 6,953,730 B2 | 10/2005 | Ahn et al. | |
| 6,958,302 B2 | 10/2005 | Ahn et al. | |
| 6,960,538 B2 | 11/2005 | Ahn et al. | |
| 6,989,573 B2 | 1/2006 | Ahn et al. | |
| 7,002,175 B1 * | 2/2006 | Singh et al. | 257/25 |
| 7,391,098 B2 | 6/2008 | Hwang | |
| 7,749,879 B2 | 7/2010 | Ahn et al. | |
| 8,269,254 B2 * | 9/2012 | Ahn et al. | 257/190 |
| 8,741,746 B2 | 6/2014 | Ahn et al. | |
| 2002/0192974 A1 | 12/2002 | Ahn et al. | |
| 2003/0045078 A1 | 3/2003 | Ahn et al. | |
| 2003/0207032 A1 | 11/2003 | Ahn et al. | |
| 2003/0207540 A1 | 11/2003 | Ahn et al. | |
| 2003/0207593 A1 | 11/2003 | Derderian et al. | |
| 2003/0227033 A1 | 12/2003 | Ahn et al. | |
| 2003/0228747 A1 | 12/2003 | Ahn et al. | |
| 2004/0043541 A1 | 3/2004 | Ahn et al. | |
| 2004/0043557 A1 | 3/2004 | Haukka et al. | |
| 2004/0043569 A1 | 3/2004 | Ahn et al. | |
| 2004/0110391 A1 * | 6/2004 | Ahn et al. | 438/778 |
| 2004/0144980 A1 | 7/2004 | Ahn et al. | |
| 2004/0175882 A1 | 9/2004 | Ahn et al. | |
| 2004/0214399 A1 | 10/2004 | Ahn et al. | |
| 2004/0262700 A1 | 12/2004 | Ahn et al. | |
| 2005/0020017 A1 | 1/2005 | Ahn et al. | |
| 2005/0054165 A1 | 3/2005 | Ahn et al. | |
| 2005/0285226 A1 | 12/2005 | Lee | |
| 2006/0024975 A1 | 2/2006 | Ahn et al. | |
| 2006/0118915 A1 | 6/2006 | Hwang | |
| 2006/0264066 A1 | 11/2006 | Bartholomew et al. | |
| 2007/0128858 A1 * | 6/2007 | Haukka et al. | 438/656 |
| 2008/0029790 A1 | 2/2008 | Ahn et al. | |
| 2010/0270590 A1 | 10/2010 | Ahn et al. | |
| 2013/0012005 A1 | 1/2013 | Ahn et al. | |

OTHER PUBLICATIONS

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, K Y, "ALD of Silicon Films on Germanium", U.S. Appl. No. 11/498,576, filed Aug. 3, 2006.

Ahn, Kie Y, "ALD of Amorphous Lanthanide Doped Tiox Films", U.S. Appl. No. 11/092,072, filed Mar. 29, 2005, 04-1321.

Ahn, Kie Y, "Atomic Layer Deposited Hafnium Tantalum Oxide Dielectrics", U.S. Appl. No. 11/029,757, filed Jan. 5, 2005.

Ahn, Kie Y, "Atomic Layer Deposited Lanthanum Aluminum Oxide Dielectric Layer", U.S. Appl. No. 10/930,167, filed Aug. 31, 2004, 04-0686.

Ahn, Kie Y, "Atomic Layer Deposited Lanthanum Hafnium Oxide Dielectrics", U.S. Appl. No. 11/010,529, filed Dec. 13, 2004.

Ahn, Kie Y, "Atomic Layer Deposited Titanium Aluminum Oxide Films", U.S. Appl. No. 10/931,533, filed Aug. 31, 2004, client ref No. 04-0579.

Ahn, Kie Y, "Atomic Layer Deposited Titanium Silicon Oxide Films", U.S. Appl. No. 11/093,104, filed Mar. 29, 2005, 05-0019.

Ahn, Kie Y, "Atomic Layer Deposited Zirconium Silicon Oxide Films", U.S. Appl. No. 11/117,121, filed Apr. 28, 2005, 05-0061.

Ahn, Kie Y, "Atomic Layer Deposition of a Ruthenium Layer to a Lanthanide Oxide Dielectric Layer", U.S. Appl. No. 11/117,125, filed Apr. 28, 2005, 05-0116.

Ahn, Kie Y, "Atomic Layer Deposition of CeO2/Al2O3 Films As Gate Dielectrics", U.S. Appl. No. 11/055,380, filed Feb. 10, 2005, 04-1094.

Ahn, Kie Y, "Atomic Layer Deposition of DY-Doped HfO2 Films As Gate Dielectrics", U.S. Appl. No. 11/053,577, filed Feb. 8, 2005, 04-1179.

Ahn, Kie Y, "Atomic Layer Deposition of Hf3N4/HfO2 Films As Gate Dielectrics", U.S. Appl. No. 11/063,717, filed Feb. 23, 2005, 04-1248.

Ahn, Kie Y, "Atomic Layer Deposition of Zr3N4/ZrO2 Films As Gate Dielectrics", U.S. Appl. No. 11/058,563, filed Feb. 15, 2005.

Ahn, Kie Y, "Atomic Layer Deposition of ZRX HFY SN1-X-Y O2 Films As High K Gate Dielectrics", U.S. Appl. No. 11/215,530, filed Aug. 29, 2005, 05-0311.

Ahn, Kie Y, "Cobalt Titanium Oxide Dielectric Films", U.S. Appl. No. 11/216,958, filed Aug. 31, 2005, 05-0523.

Ahn, Kie Y, "Conductive Layers for Hafnium Silicon Oxynitride Films", U.S. Appl. No. 11/355,490, filed Feb. 16, 2006, (Client Ref. No. 05-0987).

Ahn, Kie Y, "Gallium Lanthanide Oxide Films", U.S. Appl. No. 11/329,025, filed Jan. 10, 2006.

Ahn, Kie Y, "Hafnium Tantalum Titanium Oxide Films", U.S. Appl. No. 11/297,741, filed Dec. 8, 2005, 05-0782.

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films As Gate Dielectrics", U.S. Appl. No. 11/010,766, filed Dec. 13, 2004, 04-0997.

Ahn, Kie Y, "Iridium / Zirconium Oxide Structure", U.S. Appl. No. 11/152,759, filed Jun. 14, 2005, 05-0201.

Ahn, Kie Y, et al., "Lanthanide Yttrium Aluminum Oxide Dielectric Films", U.S. Appl. No. 11/297,567, filed Dec. 8, 2005, 05-0711.

Ahn, Kie Y, "Lanthanum Aluminum Oxynitride Dielectric Films", U.S. Application U.S. Appl. No. 11/216,474, filed Aug. 31, 2005, May 0565.

Ahn, Kie Y, et al., "Magnesium Titanium Oxide Films", U.S. Appl. No. 11/189,075, filed Jul. 25, 2005, 05-0381.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y, "Zirconium-Doped Gadolinium Oxide Films", U.S. Appl. No. 11/215,578, filed Aug. 29, 2005, 05-0597.

Bai, W P, et al., "Ge MOS characteristics with CVD HfO2 gate dielectrics and TaN gate electrode", 2003 Symposium on VLSI Technology Digest of Technical Papers, (2003), 2 pgs.

Bai, W P, et al., "Si interlayer passivation on germanium MOS capacitors with high-/spl kappa/ dielectric and metal gate", IEEE Electron Device Letters, 26(6), (Jun. 2005), 378-80.

Chang, R P, et al., "Inversion layers on germanium with low-temperature-deposited aluminum-phosphorus oxide dielectric films", Applied Physics Letters, 49(22), (Dec. 1, 1986), 1534-1536.

Chen, James Jer-Hueih, et al., "Ultrathin Al2O3 and HfOs gate dielectrics on surface-nitrided Ge", IEEE Transactions on Electron Devices, 51(9), (Sep. 2004), 1441-1447.

Chiu, Chi, et al., "A sub-400/spl deg/C germanium MOSFET technology with high-/spl kappa/ dielectric and metal gate", International Electron Devices Meeting, 2002. IEDM '02. Digest., (2002), 437-440.

Chui, C O, et al., "A germanium NMOSFET process integrating metal gate and improved hi-/spl kappa/ dielectrics", IEEE International Electron Devices Meeting, 2003. IEDM '03 Technical Digest, (2003), 437-440.

Conley, J. F, "Atomic Layer Deposition of Hafnium Oxide Using Anhydrous Hafnium Nitrate", Electrochemical and Solid-State Letters, 5(5), (May 2002), C57-059.

Hattangady, S V, et al., "Interface engineering with pseudormorphic interlayers: Ge metal insulator semiconductor structures", App. Phys Lett, 57(6), (Mar. 1990), 591-593.

Johnson, R S, et al., "New approach for the fabrication of device-quality Ge/GeO2/SiO2 interfaces using low temperature remote plasma processing", Journal of Vacuum Science & Technology A: Vacuum, Surfaces, and Films, (Jul. 2000), 1230-1233.

Kita, Koji, et al., "Oxidation-induced damages on germanium MIS capacitors with HfO2 gate dielectrics", Extended abstracts of teh 2003 International Conference on Solid State Devices and Materials, Tokyo 2003, (2003), 292-293.

(56) References Cited

OTHER PUBLICATIONS

Kukli, Kaupo, "Atomic Layer Epitaxy Growth of Tantalum Oxide Thin Films from Ta(OC2H5)5 and H2O", J. Electrochem. Soc., vol. 142, No. 5, (May 1995), 1670-1675.

Kukli, Kaupo, "Comparison of hafnium oxide films grown by atomic layer deposition from iodide and chloride precursors", Thin Solid Films, 416, (2002), 72-79.

Kukli, Kaupo, "Tailoring the dielectric properties of HfO2—Ta2O3 nanolaminates", Appl. Phys. Lett., 68, (1996), 3737-3739.

Lee, C. H., "MOS Characteristics of Ultra Thin Rapid Thermal CVD ZrO2 and Zr Silicate Gate Dielectrics", Electron Devices Meeting, 2000. IEDM Technical Digest. International, (2000), 27-30.

Lee, S J, "High quality ultra thin CVD HfO2 gate stack with poly-Si gate electrode", Electron Devices Meeting, 2000. IEDM Technical Digest. International, (2000), 31-34.

Leskela, M., "ALD precursor chemistry: Evolution and future challenges", J. Phys. IV France, 9, (1999), 837-852.

Ritenour, A, et al., "Epitaxial strained germanium p-MOSFETs with HfO/sub 2/ gate dielectric and TaN gate electrode", IEEE International Electron Devices Meeting, 2003. IEDM '03 Technical Digest, (2003), 433-436.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", Advanced Materials for Optics and Electronics, 10(3-5), (2000), 105-114.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Tiwari, Sandip, et al., "Unpinned GaAs MOS capacitors and transistors", IEEE Electron Device Letters, 9, (Sep. 1998), 488-490.

Wilk, G. D., "High-K gate dielectrics: Current status and materials properties considerations", Journal of Applied Physics, 89(10), (May 2001), 5243-5275.

Wu, Nan, et al., "A TaN HfO2 Ge pMOSFET with novel SiH4 surface passivation", IEEE Electron Device Letters, 25(9), (633), 631.

Wu, Nan, et al., "Alternative surface passivation on germanium for metal oxid semiconductor appli.cations with high k gate dielectric", Applied Physics Letters, 85(18), (Nov. 2004), 4127-4129.

Yu, D S, et al., "Al2 Ge On Insulator n and p MOSFETs with fully NiSi and NiGe dual gates", IEEE Electron Devide Letters, 25(3), (Mar. 2004), 138-140.

Zhang, H, et al., "High permitivity thin film nanolaminates", Journal of Applied Physics, 87(4), (Feb. 2000), 1921-1924.

* cited by examiner

SILICON ON GERMANIUM

RELATED APPLICATION

This application is a Continuation of U.S. application Ser. No. 13/617,211, filed 14 Sep. 2012, now issued as U.S. Pat. No. 8,741,746, which is a Continuation of U.S. application Ser. No. 12/829,099, filed 1 Jul. 2010, now issued as U.S. Pat. No. 8,269,254, which is a Divisional of U.S. application Ser. No. 11/498,576, filed 3 Aug. 2006, now issued as U.S. Pat. No. 7,749,879, all of which are incorporated herein by reference in their entirety.

TECHNICAL FIELD

This application relates generally to semiconductor devices and device fabrication and, more particularly to semiconductor structures formed on germanium substrates.

BACKGROUND

The semiconductor device industry has a continuous market driven need to improve the operational speed of electronic devices. Previously improved operational speed has been obtained by scaling the devices to reduce the transistor size. Smaller transistors result in improved operational speed and clock rate, and reduced power requirements in both standby and operational modes. To reduce transistor size, the thickness of the silicon dioxide ($SiO_2$) gate dielectric is reduced in proportion to the shrinkage of the silicon gate length. For example, a metal-oxide-semiconductor field effect transistor (MOSFET) might use a 1.5 nm thick $SiO_2$ gate dielectric for a gate length of less than 100 nm. As such physical scaling continues, various issue may surface, such as short channel effect and junction leakage, and thin gate dielectrics may be a potential reliability issue with gate leakage and time dependent dielectric breakdown. Thus, as silicon based transistors scale down, they may be reaching their fundamental physical limitations of thin gate dielectrics, and very short silicon channels. Nevertheless, smaller, lower power consuming, and more reliable integrated circuits (ICs) will likely be needed for use in products such as processors, mobile telephones, and memory devices such as dynamic random access memories (DRAMs) in the future. It has been proposed to use a substrate material having higher charge carrier mobility (and thus relatively higher device speed) than the presently used silicon substrate, such as germanium. However, germanium has manufacturing issues and reliability concerns. It has also been proposed to use gate dielectrics with higher dielectric constants (k).

The semiconductor industry reliance upon the ability to scale the dimensions of its basic devices, such as the silicon MOSFET, to achieve improved operational speed and power consumption may have reached a physical limit. Device scaling includes scaling the gate dielectric, which has primarily been silicon dioxide ($SiO_2$). A thermally grown amorphous $SiO_2$ layer on a silicon substrate provides an electrically and thermodynamically stable material interface with superior electrical isolation. However, increased scaling and other requirements in microelectronic devices have created reliability issues as the gate dielectric has become thinner. One potential partial solution includes the use of materials with higher dielectric constants (k) which would allow a thicker physical dielectric thickness with the same equivalent electrical thickness, and thus address the gate leakage and time dependent dielectric breakdown issues.

The use of germanium substrates has been proposed as a partial solution to the short channel effect and junction leakage issues, since germanium has an electron mobility that is about two times higher than in silicon, and a hole mobility that is about four times higher than in silicon. However, substrate surfaces must have a low and repeatable trapped charge density and surface trap density, and germanium oxide is water soluble, has high current leakage and low dielectric breakdown voltage. It is thought that the thermal germanium oxide to germanium substrate interface may be too intrinsically disordered to be stable and provide a consistent interface state condition required for semiconductor manufacturing.

DETAILED DESCRIPTION

Figure 1:
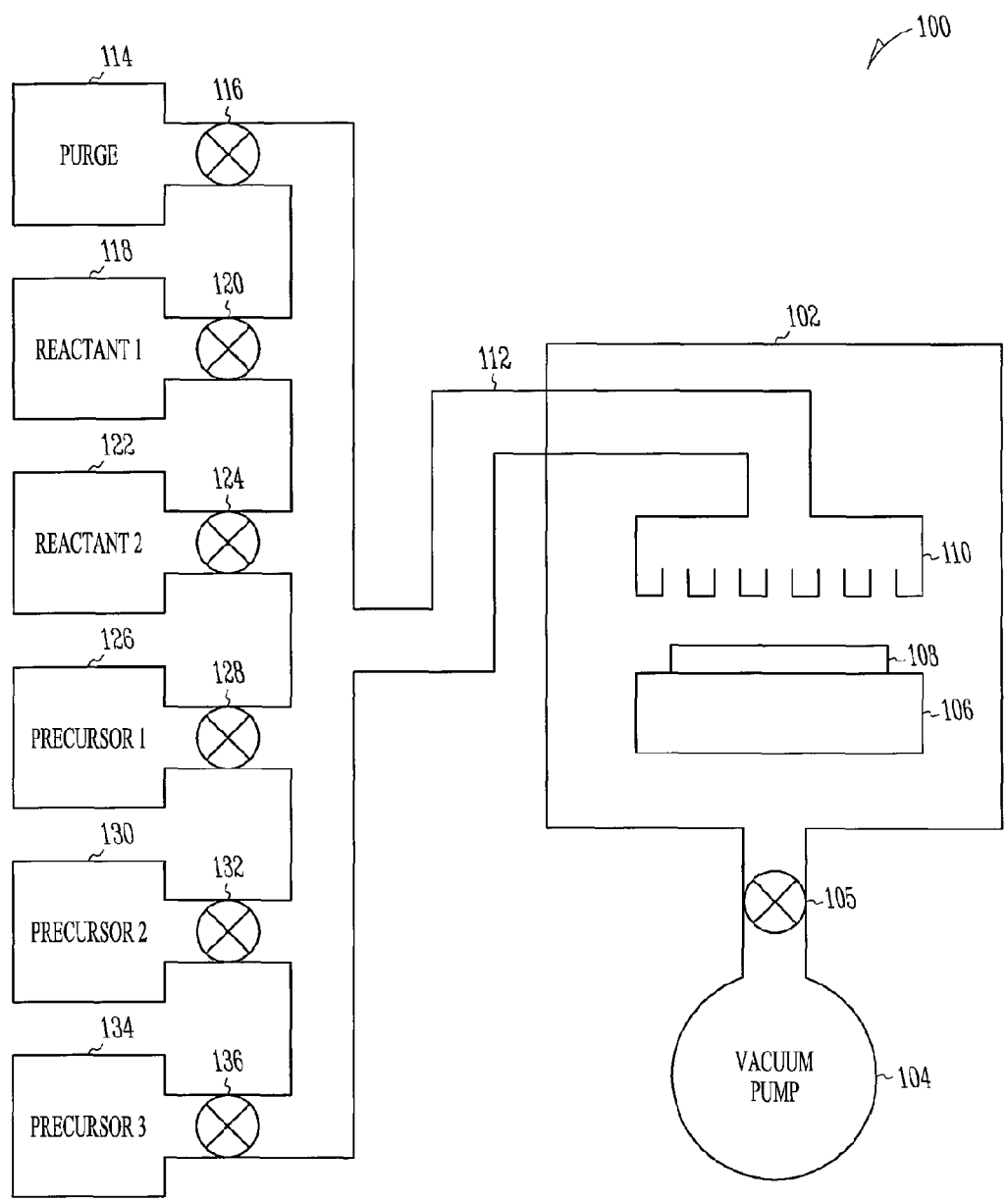
FIG. 1 illustrates an atomic layer deposition system.

The following detailed description refers to the accompanying drawings that show, by way of illustration, specific aspects and embodiments in which the present arrangement may be practiced. These embodiments are described in sufficient detail to enable those skilled in the art to practice the disclosed invention. Other embodiments may be utilized and structural, logical, and electrical changes may be made without departing from the scope of the present disclosure. The various described embodiments are not necessarily mutually exclusive, as some embodiments may be combined with one or more other embodiments to form new embodiments.

The terms "wafer" and "substrate" used in the following description include any structure having an exposed surface with which to form an integrated circuit (IC) structure. The term "substrate" is understood to include semiconductor wafers, and is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors. The term "insulator" or "dielectric" is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The gate dielectric films discussed herein may include an increased dielectric constant of gate insulator material over the typical 3.9 value of silicon dioxide, and the semiconductor substrate may include composite and multilayered materials as compared to typical single crystal silicon.

First, a general discussion on high dielectric constant (i.e., high k) materials and germanium substrates will be given. A gate dielectric in a metal oxide semiconductor (MOS) transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical silicon dioxide ($SiO_2$) layer that would have the same capacitance density as a given dielectric, ignoring leakage current and reliability considerations.

A $SiO_2$ layer of thickness, t, deposited or thermally grown on a Si substrate surface as a gate dielectric will have a $t_{eq}$ larger than its physical thickness, t. This $t_{eq}$ results from the capacitance in the surface channel on which the $SiO_2$ is formed due to the formation of a depletion/inversion region in the substrate material. This depletion/inversion region can result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness requirement for a $SiO_2$ layer used for a gate dielectric would need to be approximately 4 to 7 Å. This is very thin, almost a monolayer, of $SiO_2$ molecules, and may be very fragile.

Additional requirements for a $SiO_2$ layer would depend on the gate electrode used in conjunction with the $SiO_2$ gate dielectric. Using a conventional polysilicon gate would result in an additional undesirable increase in $t_{eq}$ for the $SiO_2$ layer. This additional thickness could be eliminated by using a metal gate electrode, which would not have a depletion layer. Typically, heavily doped polysilicon is currently used in many complementary metal-oxide-semiconductor field effect transistor (CMOS) technologies. These two effects require devices designed with a physical $SiO_2$ gate dielectric layer of as little as 4 Å.

Silicon dioxide is used as a gate dielectric, in part, due to its electrical isolation properties in a $SiO_2$—Si based structure. This electrical isolation is due to the relatively large band gap of $SiO_2$ (8.9 eV), which makes it a good insulator. Significant reductions in band gap would eliminate a material for use as a gate dielectric. However, as the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as found in a thicker (or bulk) layer. As a result of incomplete formation relative to a bulk structure, a thin $SiO_2$ layer of only one or two monolayers may not form a full band gap. The lack of a full band gap in a $SiO_2$ gate dielectric may cause an effective short between an underlying conductive silicon channel and an overlying polysilicon gate. This undesirable property sets a limit on the physical thickness to which a $SiO_2$ layer can be scaled. The minimum thickness due to this monolayer effect is thought to be about 7-8 Å. Therefore, for semiconductor devices to have a $t_{eq}$ less than about 10 Å, other dielectrics than $SiO_2$ need to be considered for use as a gate dielectric.

Thermally grown germanium oxides used as dielectrics do not have the above noted useful properties, and are water soluble, have low dielectric breakdown voltages, high leakage rates, and poor interface properties. Other dielectrics deposited on germanium substrates also have reliability issues.

For a typical dielectric layer used as a gate dielectric, the capacitance is determined as in a parallel plate capacitance: $C=k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox}$=3.9, as $$t=(k/k_{ox})t_{eq}=(k/3.9)t_{eq}.$$

Thus, materials with a dielectric constant greater than that of $SiO_2$ will have a physical thickness that can be considerably larger than a desired $t_{eq}$, while providing the desired electrical equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors may be realized by using dielectric materials with higher dielectric constants than $SiO_2$.

The thinner equivalent oxide thickness required for lower transistor operating voltages and smaller transistor dimensions may be found in many materials, but typical fabricating requirements makes replacing $SiO_2$ difficult. The microelectronics industry still uses silicon-based devices, which requires that the gate dielectric be grown on a silicon substrate. During the formation of the dielectric on the silicon layer, there exists the possibility that a small layer of $SiO_2$, known as a native oxide, may be formed in addition to the desired dielectric due to high temperature processing. The result would effectively be a dielectric layer consisting of two sub-layers in connection with each other and with the silicon layer on which the dielectric is formed. The resulting overall capacitance would be that of two dielectrics in series. The $t_{eq}$ of the dielectric layer is the sum of the $SiO_2$ thickness and a multiplicative factor of the thickness, t, of the dielectric being formed with a dielectric constant of k, written as $$t_{eq}=t_{SiO2}+(k_{ox}/k)t.$$

Thus, if a $SiO_2$ layer is unintentionally formed during the gate insulator process, the $t_{eq}$ is once again substantially limited by a low dielectric constant $SiO_2$ layer. In the event that a barrier layer is formed between the silicon layer and the gate dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer directly in contact, or interfacing with the silicon layer must provide a high quality interface to maintain high channel carrier mobility. Preventing the formation of an undesirable $SiO_2$ layer is one advantage of using lower temperatures in an atomic layer deposition (ALD) process.

One of the advantages of using $SiO_2$ as a gate dielectric has been that the formation of the $SiO_2$ layer results in an amorphous gate dielectric. Having an amorphous structure for a gate dielectric provides reduced leakage current associated with grain boundaries in polycrystalline gate dielectrics, which may cause high leakage paths. Additionally, grain size and orientation changes throughout a polycrystalline gate dielectric may cause variations in the film's dielectric constant, along with uniformity and surface topography issues. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form. The amorphous nature of the film is another advantage of using the lower deposition temperatures available in the ALD deposition process.

Another consideration for selecting the material and method for forming a dielectric film concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer, due among other reasons to the increase electrical field strength found at sharp points or asperities. This is yet another advantage of using ALD processes that provide smooth surfaces compared to other deposition methods. For example, during a conventional sputtering deposition process, particles of the material to be deposited bombard the substrate surface at a high energy. When a particle hits the surface, some particles adhere, and other particles may cause damage. High energy impacts may create pits. The surface of a sputtered layer may be rough due to the rough interface at the substrate.

A dielectric film formed using atomic layer deposition (ALD) will have a substantially smooth surface relative to other processing techniques, can provide for controlling transitions between material layers, and have tight control of thickness and uniformity. As a result of such control, atomic layer deposited dielectric film may have an engineered transition with a substrate surface, or may be formed with many thin layers of different dielectric materials to enable selection of the dielectric constant and other material properties to a value between that available from pure dielectric compounds.

In addition to the use of high k dielectric materials for the gate dielectric, the semiconductor substrate material may be changed from silicon to germanium in order to obtain greatly improved conduction speed and increased performance. Germanium has about twice the electron mobility and four times the hole mobility of silicon. But the poor surface interface found in either thermally grown or deposited dielectrics on the germanium surface have been an issue. The use of a germanium oxynitride ($GeO_XN_Y$), and other nitridation processes, using ammonia ($NH_3$) or other nitrogen sources, to improve the interface states and reduce native germanium oxidation has not resulted in a fully passivated surface, and has been found to induce positive fixed surface charges as high as $6.8 \times 10^{12}$ charges/$cm^2$. The use of a thin silicon layer directly on the germanium substrate permits the growth or deposition of various dielectrics without compromising the interface or the improved charge mobility obtained with germanium substrates. The thin silicon layer may have as few as a single monolayer of silicon atoms, but is beneficially uniform in thickness and composition across at least the MOS channel region. Such a level of uniformity in composition and thickness may be found in ALD reactors, which will now be discussed.

A general discussion of atomic layer deposition (ALD) will be given to describe how the use of ALD improves the individual layer properties discussed above and improves manufacturability and process control. ALD, which may also be known as atomic layer epitaxy (ALE), may be considered as a modification of chemical vapor deposition (CVD), and may also be called "alternatively pulsed-CVD." In ALD, precursors are introduced one at a time to the substrate surface mounted within a reaction chamber (or reactor). The precursors may be a gas, or a sublimated solid, or a vaporized liquid, or an atomized liquid, among numerous possible forms of chemical precursors. This introduction of the precursors takes the form of sequential pulses of each precursor. In a pulse of a precursor, the precursor is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed (or adsorbed) at the substrate surface, during the first pulsing phase. Subsequent pulsing with a purging gas removes excess precursor from the reaction chamber, specifically the precursor that has not been chemisorbed on to the surface.

The second pulsing phase introduces a second precursor to the substrate where the growth reaction of the desired film takes place, with a reaction thickness that depends upon the amount of the chemisorbed first precursor. Subsequent to the film growth reaction, reaction byproducts and excess precursor material are purged from the reaction chamber. With a precursor chemistry where the precursors adsorb and aggressively react with each other on the substrate, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting, which results in large area uniformity in composition and thickness, and superior conformality to other methods. ALD provides controlled film thickness in a straightforward manner by controlling the number of growth cycles. Each growth cycle may produce a single monolayer.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid condensation of the precursors on the substrate. Due to the self-limiting growth mechanisms of ALD, relatively low vapor pressure solid precursors may be used, though evaporation rates may vary somewhat during the process because of changes in surface area of the solid precursor.

Other desirable characteristics for ALD precursors include thermal stability at the substrate deposition temperature, since precursor decomposition may destroy surface control, which relies on the reaction of the precursor at the substrate surface. A slight decomposition, if slow compared to the ALD growth rate, may be tolerated. The precursors should chemisorb on, or react with the surface, though the interaction between the precursor and the surface as well as the mechanism for the adsorption is different for different precursors. The molecules at the substrate surface should react aggressively with the second precursor, which for convenience may be called a reactant, to form the desired film. Additionally, precursors should not react with the film to cause etching, and precursors should not dissolve in the film. The ability to use highly reactive chemical precursors in ALD may contrast with the precursors for conventional metallo-organic CVD (MOCVD) type reactions. Further, the by-products of the reaction should be gaseous in order to allow their easy removal from the reaction chamber during a purge stage. Finally, the by-products should not react or adsorb on the surface.

In an ALD process, the self-limiting process sequence involves sequential surface chemical reactions. ALD relies on chemistry between a reactive surface and a reactive molecular precursor. In an ALD process, molecular precursors are pulsed into the ALD reaction chamber separately. The precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition thickness per cycle, and composition. ALD sequences generally deposit less than a full layer per cycle. Typically, a deposition or growth rate of about 0.25 to about 2.00 Å per ALD cycle can be realized.

The advantages of ALD include continuity at an interface and avoiding poorly defined nucleating regions, which are typically found in other thin film deposition methods, for example, chemical vapor depositions (<20 Å) or physical vapor depositions (<50 Å) film. Other advantages of ALD depositions include conformality over a variety of substrate topologies, due to its layer-by-layer deposition technique, use of low deposition temperature and mildly oxidizing processes, lack of dependence on the reaction chamber conditions, growth thickness dependent solely on the number of cycles performed, and ability to engineer multilayer laminate films with resolution of one to two monolayers. ALD processes allow deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that chemically adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. There need not be a reactant gas if the precursor can interact with the substrate directly, as in the case of a dopant metal layer on a dielectric layer. In the case where the thickness of the first series of ALD cycles results in a dielectric layer that is only a few molecular layers thick, and the second series of cycles also results in a different dielectric layer that is only a few molecular layers thick, this may be known as a nanolayer material, or a nanolaminate. A nanolaminate means a composite film of ultra-thin layers of two or more different materials in a layered stack, where the layers are alternating layers of different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may for example, obtain a dielectric constant that is between the values of the two or more materials singly. A nanolaminate may also include having several layers of one material formed by an ALD reaction either over or under a single layer of a different material formed by another type of reaction, such as a MOCVD reaction. The layers of different materials may remain separate after deposition, or they may react with each other to form an alloy layer.

The alloy layer may be viewed as a doping layer, and the properties of the dielectric layer may be varied by such doping.

The above described ALD method is used for forming a thin uniform film of silicon as an interlayer on a germanium substrate. The use of germanium as the substrate material allows much faster operation, while the silicon interlayer provides a stable interface. To obtain a further improvement in operational speed, the illustrative embodiments use a high k dielectric material as the gate dielectric on the silicon interlayer, but the embodiments are not so limited, and a low k material may be used. An illustrative embodiment uses hafnium dioxide ($HfO_2$) as the high k gate dielectric material. Alternately, zirconium or titanium oxides may be used, or other well known high k dielectrics such as STO, BTO, barium oxide, strontium oxide, or combinations and nanolaminates of hafnium and zirconium oxides, and others. The illustrative embodiments include the use of a tantalum nitride gate electrode layer, but the embodiments are not so limited. Any conductive material may be used for the gate electrode, or combinations of materials or what may be known as stack gates.

In an illustrative embodiment, a (100) oriented n-type germanium substrate is doped with antimony (Sb) at around $5 \times 10^{16}$ $cm^{-3}$, to form an n-type wafer. The substrate is cleaning with a dilute hydrofluoric (HF) acid wash, for example 50 parts water to one part HF, to remove any native oxide ($GeO_2$) or contaminants, and rinsed in deionized water (DI). A silicon interlayer is deposited on the substrate by ALD at a substrate temperature of 580° C. with a precursor of silane gas ($SiH_4$) and an argon (Ar) purge gas. The silicon interlayer may be further stabilized by annealing in an ammonia ($NH_3$) ambient. The anneal may be preformed using a rapid thermal anneal (RTA) using intense light, laser, or other energetic means, for example two minutes at 550° C., or equivalent heat cycle. The anneal may form a more stable interfacial layer and prevent oxidation of the silicon interlayer, which as noted previously, may adversely affect the effective capacitance of the gate dielectric.

A hafnium oxide ($HfO_2$) film is formed on the silicon interlayer using sequential atomic layer deposition (ALD) at 400° C. An embodiment includes forming the hafnium oxide layer using a precursor gas such as hafnium tetra-chloride, having a chemical formula of $HfCl_4$ and water vapor. Other precursors may be used such as anhydrous hafnium nitrate ($Hf(NO_3)_4$) and water vapor at 160° C. Yet other precursors may include hafnium containing compounds such as tetraisoproxide, or a diketonate chelate precursor gas such as tetramethyl heptanedione or dipivaloylmethane, bis(pentamethyl-cyclopentadienyl), bis(triisopropyi-cyclopentadienyl), ozone, oxygen, nitrous oxide and hydrogen peroxide. Other solid or liquid precursors may be used in an appropriately designed reaction chamber. The use of such precursors in an ALD reaction chamber may result in lower deposition temperatures in the range of 180° C. to 940° C., more preferably 325° C. to 425° C. Purge gases may include nitrogen, helium, argon or neon. The hafnium oxide films formed may have good thermal and electrical properties, with a high dielectric constant compared to the 3.9 of silicon dioxide. Such films may survive high temperature anneals (sometimes used to reduce fixed surface state charges and improve metal to semiconductor resistance) of up to 1000° C. (more preferably 500° C.), and have low leakage currents of less than $2 \times 10^{-7}$ $A/cm^2$ at electric field strengths of greater than one MVolt/cm.

A gate electrode layer of TaN, in an embodiment 150 nanometer (nm) in thickness is formed by ALD at 325° C. using an illustrative precursor of $Ta(OC_2H_5)_5$, which may be evaporated from an open topped container held at 105° C., and a reactant material of water vapor. Such an arrangement allows for a thermally and electrically stable, highly reproducible gate electrode and dielectric.

FIG. 1 shows an embodiment of an atomic layer deposition system 100 for forming a silicon interlayer on a germanium substrate, a high k dielectric film and a titanium nitride gate electrode. The elements depicted permit those skilled in the art to practice the disclosed embodiments without undue experimentation. In FIG. 1, a substrate 108, germanium in an embodiment, on a heating element/wafer holder 106 is located inside a reaction chamber 102 of ALD system 100. The heating element 106 is thermally coupled to substrate 108 to control the substrate temperature. A gas distribution fixture 110 introduces precursor, reactant and purge materials to the substrate 108 in a uniform fashion. The materials may be gases, vaporized or atomized liquids, or sublimated solids, but may be referred to as gases herein for simplicity. The gas distribution fixture, sometimes referred to as a showerhead, allows the precursor materials to react with the substrate 108. Excess gas and reaction products are removed from chamber 102 by vacuum pump 104 through control valve 105. Each gas originates from individual gas sources 114, 118, 122, 126, 130, and 134, with a flow rate and time controlled by mass-flow controllers 116, 120, 124, 128, 132 and 136. Gas sources 126, 130 and 134 provide a variety of precursor gases, either by storing the precursor as a gas or by providing for evaporating a solid or liquid material to form the selected precursor gas.

Also included in the system is purging gas source 114, coupled to mass-flow controller 116. The embodiment may use only one purge gas for all disclosed illustrative purging steps, or additional purge gas sources may be added in any desired number, such that in the general case any purge gas may be used in any particular step, or any combination of purge gases may be used simultaneously, or alternating the purge gases as required for the particular desired result. Additional purging gas sources can be constructed in ALD system 100, for example, one purging gas source for each different precursor and reactant gas. For a process that uses the same purging gas for multiple precursor gases, fewer purging gas sources may be required for ALD system 100, as in the current illustrative embodiment.

The precursor gas used may be a combination of various precursors to form a combination layer. The precursor, reactant and purge gas sources are coupled by their associated mass-flow controllers (116, 120, 124, 128, 132 and 136) to a common gas line, or conduit 112, which is coupled to the gas-distribution fixture 110 inside the reaction chamber 102. Gas conduit 112 may also be coupled to an additional vacuum pump, or exhaust pump (not shown), to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. It is also possible to control the effective precursor gas pumping rate by means of what may be known as ballasting the system, by means of an inert gas input somewhere in the system, for example in the vacuum pump 104. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present embodiment, other commercially available ALD systems may also be used.

The use and operation of reaction chambers for deposition of films are understood by those of ordinary skill in the art of semiconductor fabrication. The disclosed embodiments may be practiced on a variety of such reaction chambers without undue experimentation. Furthermore, one of ordinary skill in the art will comprehend the necessary detection, measurement, and control techniques in the art of semiconductor fabrication upon reading the disclosure. The elements of ALD system 100 may be controlled by a computer using a computer readable medium to control the individual elements such as pressure control, temperature control, and gas flow within ALD system 100. To focus on the use of ALD system 100 in the various disclosed embodiments, the computer is not shown. Those skilled in the art can appreciate that system 100 may be under computer control.

Figure 2:
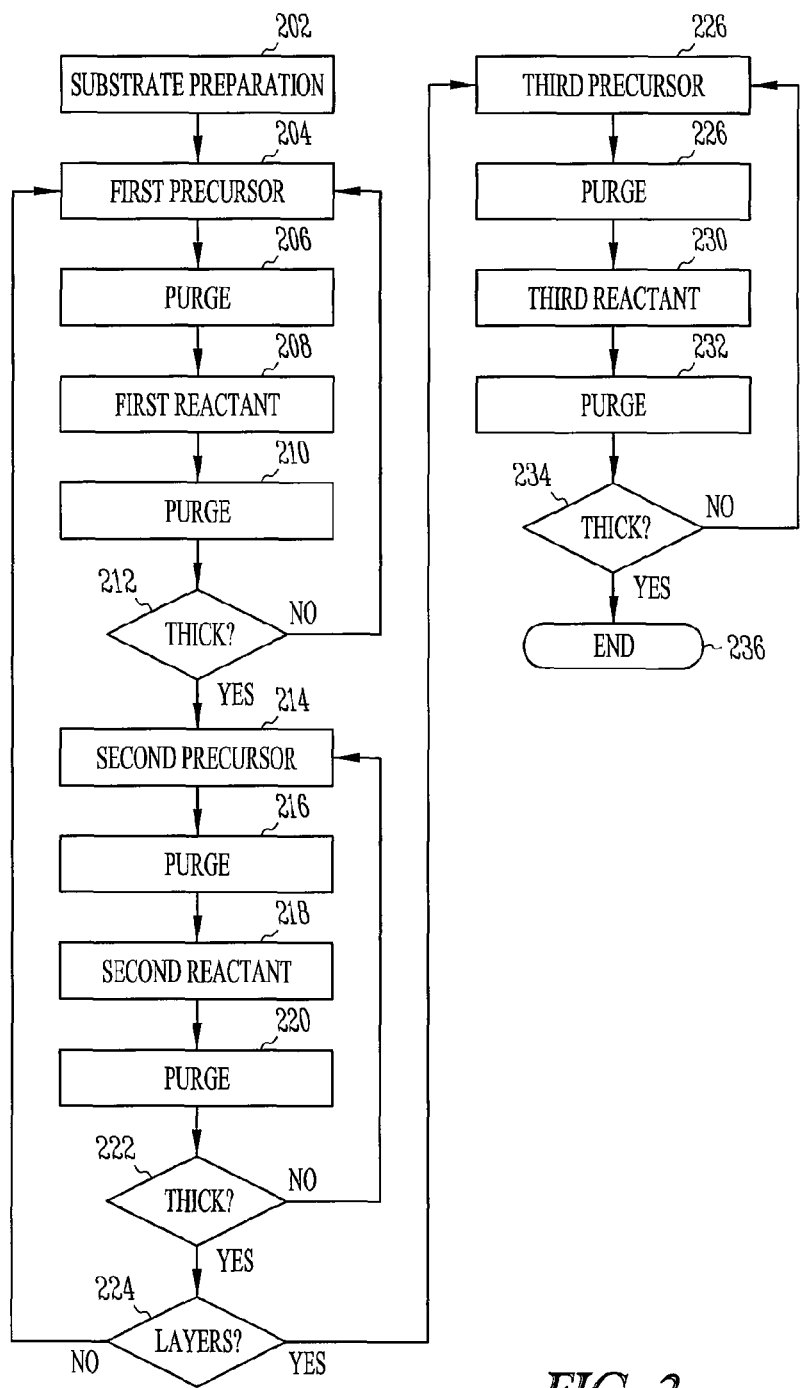
FIG. 2 illustrates a flow diagram for an embodiment of a method to form a semiconductor structure by atomic layer deposition.

FIG. 2 illustrates a flow diagram of operational steps for an embodiment of a method to form a series of ALD layers having an illustrative three different materials: silicon, hafnium oxide and titanium nitride. Each of the three different materials, which in the general case each layer, may be a combination of materials. At 202, a substrate is prepared to react immediately with, and chemisorb the first precursor gas, or combination of precursor gases. This preparation will remove contaminants such as thin organic films, dirt, and native oxide from the surface of the substrate, and may include a hydrofluoric acid rinse, or sputter etching in the reaction chamber 102. At 204 a first precursor material, or combination of precursor materials, enters the reaction chamber for a predetermined length of time, for example 0.5-2.0 seconds. The first precursor material is chemically adsorbed onto the surface of the substrate, the amount depending upon the temperature of the substrate, in one embodiment 580° C. for silane and argon for a silicon interlayer, or 400° C. hafnium tetrachloride for hafnium oxide, or 325° C. with $Ta(OC_2H_5)_5$ for the TaN layer. In each case the temperature and the presence of sufficient flow of the precursor materials controls the amount of adsorbed material, and thus the layer thickness for that cycle. In addition, the pulsing of the precursor may use a period providing uniform coverage of an adsorbed monolayer on the substrate surface, or may use a period that provides partial formation of a monolayer on the substrate surface.

At 206 a first purge gas enters the reaction chamber for a predetermined length of time sufficient to remove substantially all of the non-chemisorbed first precursor materials. Typical times may be 1.0-2.0 seconds, with a purge gas comprising nitrogen, argon, neon, combinations thereof, or other gases such as hydrogen. At 208 a first reactant gas may in the general case enter the chamber for a predetermined length of time, sufficient to provide enough of the reactant to chemically combine with the amount of chemisorbed first precursor material on the surface of the substrate. In the present embodiment of forming a silicon interlayer no reactant may be needed depending upon the substrate temperature, or a nitrogen gas flow may be used. Typical reactant materials may include mildly oxidizing materials such as water vapor, but may in general also include hydrogen peroxide, various nitrogen oxides such as nitrous oxide, ozone and oxygen gas, and combinations thereof. It should be noted that the difference between a precursor and a reactant is basically the timing of the introduction of the material into the reaction chamber. At 210 a second purge gas, which may be the same or different from the first purge gas, enters the chamber for a predetermined length of time, sufficient to remove substantially all non-reacted materials and any reaction byproducts from the chamber.

At 212 a decision is made as to whether or not the thickness of the first material has reached the desired thickness, in an embodiment the interlayer of silicon, or whether another deposition cycle is required of the first material. If another deposition cycle is needed, then the operation returns to 204, until the desired first layer is completed, at which time the process moves on to the deposition of the second material at 214.

At 214 a second precursor material, or combination of precursor materials, enters the reaction chamber for a predetermined length of time, typically 0.5-2.0 seconds. The second precursor material is chemically adsorbed onto the surface of the substrate, in this case the top surface of the first material, the amount of absorption depending upon the temperature of the substrate, and the presence of sufficient flow of the precursor material. In addition, the pulsing of the precursor may use a period that provides uniform coverage of an adsorbed monolayer on the substrate surface, or may use a period that provides partial formation of a monolayer on the substrate.

At 216 the first purge gas is shown as entering the chamber, but the invention is not so limited. The purge gas used in the second material deposition, in an embodiment hafnium oxide, may be the same or different from either of the two previously noted purge gases, and FIG. 1 could be shown as having more than the two purge gases illustrated. The purge cycle continues for a predetermined length of time sufficient to remove substantially all of the non-chemisorbed second precursor material.

At 218 an illustrative second reactant gas, which may be the same or different from the first reactant gas, enters the chamber for a predetermined length of time, sufficient to provide enough of the reactant to chemically combine with the amount of chemisorbed second precursor material on the surface of the substrate. In an embodiment the reactant is water vapor. In certain general cases there may be no second reactant gas, and the precursor chemically reacts with the first material to form an alloy or a doped layer of the first material. At 220 a purge gas enters the chamber, which may be the same or different from any of the previously discussed purge gases, for a predetermined length of time, sufficient to remove substantially all non-reacted materials and any reaction byproducts from the chamber.

At 222 a decision is made as to whether or not the thickness of the second material has reached the desired thickness, or whether another deposition cycle is required. If another deposition cycle is needed, then the operation returns to 214, until the desired second layer is completed. The desired thicknesses of the first and second materials in the dielectric may not be the same thickness, and there may be more deposition cycles for one material as compared to the other. The thickness of each of the first two layers may be selected to obtain a desired final composition, in an embodiment a thick enough layer of silicon to support a gate dielectric layer of hafnium oxide with good interface properties. If the second layer has reached the desired thickness, the process moves on to a decision at 224 of whether the number of layers of the first and second materials has reached the desired number. In this illustrative embodiment a single layer of the first material and a single layer of the second material have been completed at this point in the process, which in the currently described embodiment are the desired interlayer of silicon and a dielectric layer of a desired number of hafnium oxide layers. In the more general case, if more than a single layer of each material is desired, the process moves back to another deposition of the first dielectric material at 204. After the number of interleaved layers of materials one and two has reached the desired value, the deposition process goes to the third layer deposition at 226 in this illustrative embodiment. In the general case, the gate electrode material may be deposited by ALD in a different reactor, or may be deposited by MOCVD or other deposition method. In the embodiment the third deposition is tantalum nitride, and the deposition occurs as described previously for the first and second layers.

At 226 the third precursor enters the chamber for a specified period of time sufficient to saturate the surface. In an embodiment the third precursor is $Ta(OC_2H_5)_5$, which is a liquid, and thus may be evaporated, or entrained in a carrier gas flow via a bubbler. At 228 a purge gas enters the chamber, followed at 230 by the third reactant, in an embodiment water vapor. At 232 a purge gas removes the reaction products and un-reacted precursors and reactants. At 234 the number of cycles of TiN growth is compared to the desired thickness, and the process returns to 226 if another layer is required, or ends at 236 if the final thickness has been reached via the correct number of ALD cycles.

The embodiments described herein provide a process for growing a silicon interlayer on a germanium substrate by ALD, a high k dielectric layer on the silicon interlayer by ALD, and a tantalum nitride gate electrode by ALD, but the embodiments are not so limited, and may include non ALD depositions. The described materials and process may be implemented to form transistors, capacitors, non volatile memory devices, micro-electro-mechanical devices (MEMs) and other electronic systems including information handling devices. The disclosed embodiments are not limited to three different materials as in the disclosed embodiments, and the equipment described in FIG. 1 could include more or fewer precursor and reactant materials, which are not described for simplicity.

Figure 3:
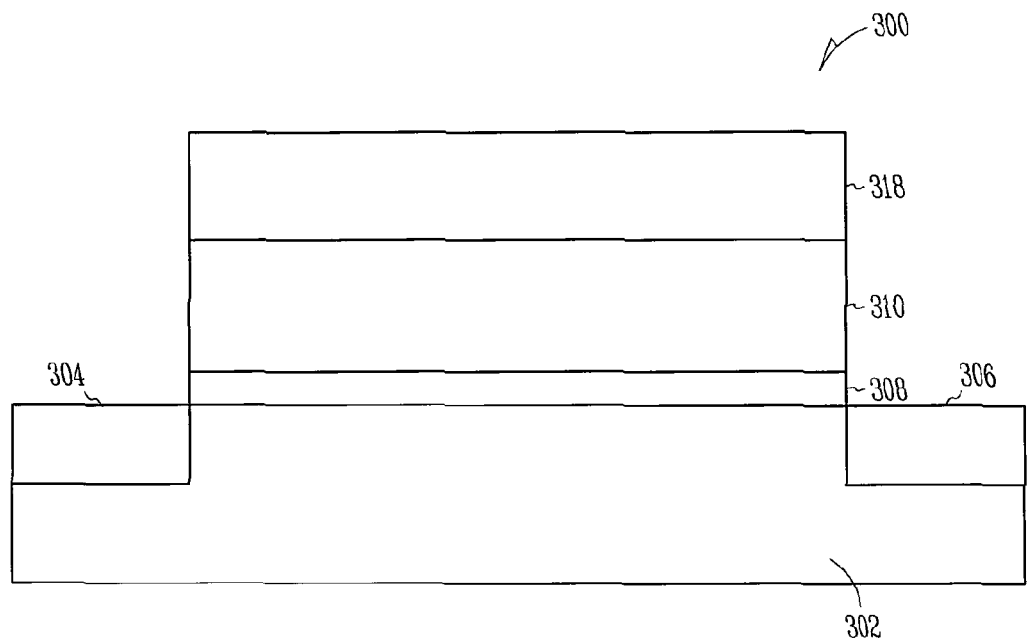
FIG. 3 illustrates a transistor formed by an atomic layer deposition, according to an embodiment.

FIG. 3 illustrates a single transistor 300 in an embodiment of a method to form a metal oxide semiconductor field effect transistor (MOSFET) containing an ALD deposited silicon interlayer, a high k gate oxide layer and a TaN gate electrode. This embodiment may be implemented with the system 100 of FIG. 1 used as an atomic layer deposition system. A substrate 302 is prepared, in an embodiment a germanium substrate, including cleaning substrate 302 and forming various layers and regions of the substrate, such as drain diffusion 304 and source diffusion 306 of an illustrative GeSi metal oxide semiconductor (MOS) transistor 300, which may occur prior to forming a gate dielectric, or after forming the gate dielectric and gate electrode, using the well known self aligning method. The substrate may be cleaned to provide an initial substrate depleted of its native oxide to avoid having the above described situation of two capacitors in series. The initial substrate may be cleaned to provide a hydrogen-terminated surface to avoid potential surface state traps and trapped charges. The substrate may undergo a final hydrofluoric (HF) rinse prior to ALD processing to provide the silicon substrate with a hydrogen-terminated surface without a native oxide layer. Cleaning immediately preceding atomic layer deposition aids in reducing an occurrence of an oxide as an interface between the germanium based substrate and the silicon interlayer, or between the interlayer and the gate dielectric formed using the atomic layer deposition process. The sequencing of the formation of the regions of the transistor being processed may follow the generally understood fabrication of a MOS transistor, as is well known to those skilled in the art.

The silicon interlayer 308 covering the area on the substrate 302 between the source and drain diffused regions 304 and 306 may be deposited by ALD in this illustrative embodiment, and may comprise one or more silicon layers to obtain a desired silicon thickness. The silicon interlayer may be formed of multiple silicon monolayers, and may have any desired thickness to obtain a desired interface state density between the layer 308 and the germanium substrate 302. The silicon interlayer 308 may have an extent greater than the distance between the source 304 and the drain 306, as shown in the figure, and in general may typically extend over the entirety of the surface of the germanium substrate (or wafer).

A gate dielectric 310, in an embodiment a high k dielectric such as hafnium oxide, is formed on the silicon interlayer, typically without removing the substrate from the vacuum chamber in which the silicon interlayer was grown. This may be done to eliminate potential contamination and oxidation sources. In an embodiment, the ALD deposition includes a precursor of anhydrous hafnium nitride and a reactant of water vapor at a substrate temperature of from 160° C. to 250° C. A single ALD cycle may result in a layer of from 1-14 Å per deposition cycle, depending upon the deposition parameters used such as precursor, temperature, flow rate and reactant. To obtain an effective gate dielectric that is electrically equivalent to a 5 Å silicon dioxide layer, the hafnium oxide layer, which may have a dielectric constant of about 12, could be as thick as 15 Å, and depending upon the exact temperature and precursor chemistry, may represent from 2 to 15 ALD cycles, each taking as few as 1-2 minutes.

There may be a diffusion barrier layer (not shown for simplicity) inserted between the dielectric layer 310 and the silicon interlayer 308 on the substrate 302 to prevent metal contamination from the metallic component of the gate oxide (hafnium in this illustrative embodiment) from affecting the electrical properties of the device. The transistor 300 has a conductive material forming a gate electrode 318, in this illustrative embodiment formed of ALD layers of tantalum nitride, formed by use of a Ta $(OC_2H_5)_5$ precursor, and a water vapor reactant at 325° C. However, any conductive media may be used for the gate electrode, and the conductive media may be selected to obtain a specific work function. The conductive material may be polysilicon, various metals, refractory metals, or metal silicides.

As illustrative embodiments, the described structure may be used as a simple transistor having high carrier mobility due to the germanium substrate, a controllable and relatively high dielectric constant gate dielectric, and a stable gate electrode having a desired work function. Similar structures may also be used as a non volatile memory device, as a capacitor, or as a tunnel gate insulator, or as a floating gate dielectric in a flash memory device. Use of the described structures is not limited to germanium substrates, but may be used with a variety of other semiconductor substrates, such as by forming a germanium layer on a silicon substrate, then forming the silicon interlayer 308 on the germanium layer. Other embodiments of the described structure may also include devices used in various integrated circuits, memory devices, and electronic systems.

Figure 4:
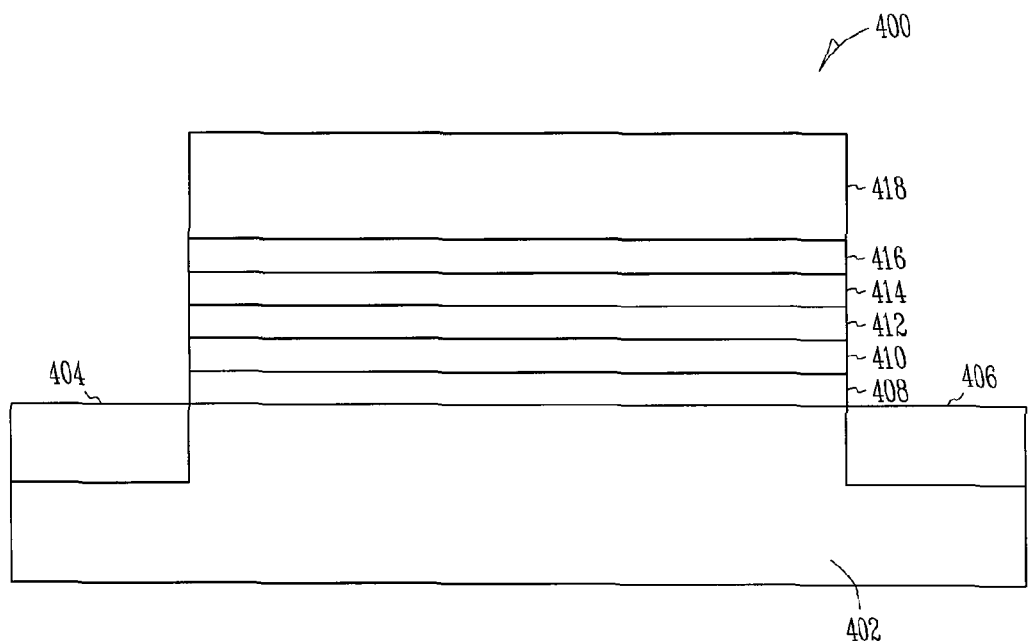
FIG. 4 shows a different transistor formed by an atomic layer deposition, according to an embodiment.

FIG. 4 illustrates an alternative transistor 400, having combinations of two or more gate dielectric materials, including the use of interleaved layers of varying thickness for the gate dielectric 310 of FIG. 3. This laminated dielectric formed of layers of different materials may be referred to as the gate oxide, and while shown as individual distinct layers for clarity, is typically effective either as a single alloyed layer, or a substituted layer, or a doped layer.

In an embodiment including a transistor 400, the germanium substrate 402, has source and drain regions 404 and 406 formed either before or after the gate electrode 418 is formed.

The gate dielectric is formed of a laminated dielectric having interleaved layers 410-416 of two different materials, for example hafnium oxide 410 and 414, and titanium oxide 412 and 416. The sequencing and thickness of the individual layers of the gate dielectric may depend upon the application and may include a single layer of each material, one layer of one of the materials and multiple layers of the other, or other combinations of layers including different layer thicknesses. By selecting thickness and composition of each layer, a nanolaminate structure can be engineered to have a predetermined dielectric constant and composition. Although the material layers are shown in this illustrative example as being distinct layers, the oxide may be alloyed to form a single material layer having the desired dielectric constant. The illustrative embodiment shows the dielectric layers 410, 412, 414 and 416 having the same thickness; however the desired dielectric properties of the nanolaminate film may be best achieved by adjusting the ratio of the thickness of the dielectric layers to different values. For example it may be desired to have the dielectric constant value change in the dielectric near the silicon interlayer 408 and the substrate 402 versus near the gate electrode 418. This may be known as a graded dielectric. Transistors, capacitors, and other electronic devices having the structures shown in FIGS. 3 and 4 may be used in memory devices and electronic systems including information handling devices such as wireless systems, telecommunication systems, computers and integrated circuits.

Figure 5:
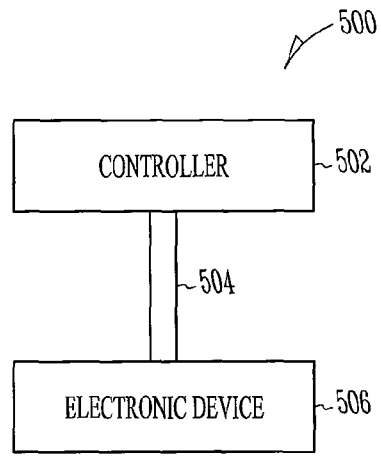
FIG. 5 is a simplified diagram for a controller coupled to an electronic device, according to an embodiment.

FIG. 5 illustrates a diagram for an electronic system 500 having one or more devices having a germanium transistor containing an atomic layer deposited silicon interlayer, gate insulator and gate electrode formed according to various embodiments. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a dielectric layer containing germanium transistors formed by ALD layers as previously discussed herein. Electronic system 500 may include, but is not limited to, information handling devices, wireless systems, telecommunication systems, fiber optic systems, electro-optic systems, and computers.

Figure 6:
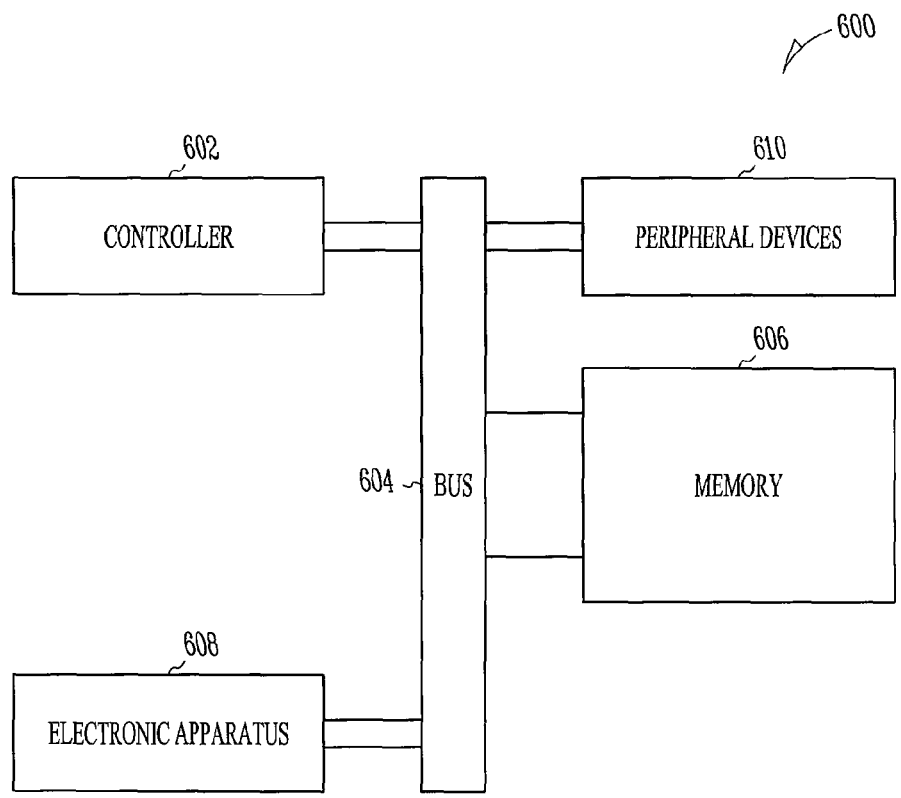
FIG. 6 is a diagram for an electronic system having devices containing an atomic layer deposited structure, according to an embodiment.

FIG. 6 depicts a diagram of an embodiment of a system 600 having a controller 602 and a memory 606. Controller 602 and/or memory 606 include an ALD formed germanium transistor with a silicon interlayer in accordance with the disclosure. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral devices 610 may include an ALD formed germanium transistor with a silicon interlayer, in accordance with the disclosed embodiments.

System 600 may include, but is not limited to, information handling devices, telecommunication systems, computers, cameras, phones, wireless devices, displays, chip sets, set top boxes, games and vehicles. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

The disclosed embodiments include a method for making devices by forming a silicon layer on a single crystal germanium semiconductor substrate by atomic layer deposition at a predetermined temperature, forming a dielectric layer on the silicon layer; and forming an electrically conductive layer on the dielectric layer. The atomic layer deposition process includes exposing a surface at a preselected temperature to a precursor material for a preselected time period and a preselected flow volume of the precursor material to saturate the substrate surface with the precursor material as a first step. Then exposing the surface to a preselected volume of a purge material for a preselected time period to remove substantially all of a non-adsorbed portion of the precursor material from the surface, to prepare for the second step. Then exposing the surface to a preselected volume of a reactant material for a preselected time period to react with the adsorbed portion of the precursor material on the substrate surface to form a material layer having a first intermediate thickness, which essentially completes a first deposition cycle. Finally exposing the substrate surface to a preselected volume of a purge material for a preselected time period to remove substantially all of a non-reacted portion of the reactant material, and a plurality of reaction byproducts from the surface, and repeating the first deposition cycle until a final dielectric material thickness is obtained for the material layer.

Typical precursors include hafnium tetrachloride, hafnium tetraiodide, hafnium nitride, silane, and $Ta(OC_2H_5)_5$, which react with reactants such as water vapor, nitrous oxide, hydrogen peroxide, ozone and oxygen at temperatures of from 325 to 650° C. to form the monolayers of the material. Typical purge materials include inert gases such as argon, neon, helium, and gases that do not react at the deposition conditions such as nitrogen and hydrogen.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. An electronic device comprising:
    a substrate including germanium;
    a silicon region disposed on and contacting the substrate, the silicon region covering the germanium of the substrate such that the silicon region is uniform in composition and thickness on a monolayer basis;
    a dielectric adjacent the silicon region, the dielectric having a dielectric constant greater than that of silicon dioxide.

2. The electronic device of claim 1, wherein the silicon region has a thickness in a range from one monolayer to several monolayers.

3. The electronic device of claim 1, wherein the substrate is a silicon substrate having a germanium region on which the silicon region is disposed and contacts the substrate.

4. The electronic device of claim 1, wherein the substrate is a single crystal germanium semiconductor substrate.

5. The electronic device of claim 1, wherein the dielectric includes a dielectric metal oxide.

6. The electronic device of claim 5, wherein a dielectric diffusion barrier material is disposed between the dielectric and the silicon region, the dielectric diffusion barrier material selected to prevent metal contamination from the dielectric metal oxide affecting electrical properties of the electronic device.

7. The electronic device of claim 1, wherein a conductive material is disposed on the dielectric.

8. The electronic device of claim 7, wherein the conductive material includes one or more of polysilicon, a metal, or a metal silicide.

9. The electronic device of claim 7, wherein the substrate, the silicon region, the dielectric, and the conductive material are arranged as a transistor having carrier mobility due to the germanium of the substrate.

10. The electronic device of claim 1, wherein the dielectric includes a dielectric material having a dielectric constant of greater than 10.

11. The electronic device of claim 10, wherein the dielectric includes one or more of hafnium oxide, zirconium oxide, titanium oxide, STO, BTO, barium oxide, or strontium oxide.

12. The electronic device of claim 1, wherein the dielectric has a dielectric constant that is graded across the dielectric.

13. An electronic device comprising:
    a memory array on a substrate including germanium, the memory array having a plurality of storage portions, each storage portion of the memory array including:
    a silicon region disposed on and contacting the substrate, the silicon region covering germanium of the substrate such that the silicon region is uniform in composition and thickness on a monolayer basis;
    a dielectric adjacent the silicon region, the dielectric having a dielectric constant greater than that of silicon dioxide.

14. The electronic device of claim 13, wherein the substrate includes a channel region separating a source region from a drain region of a transistor, the channel region adjacent the silicon region, the channel region comprising germanium.

15. The electronic device of claim 14, wherein the germanium of the channel region is single crystal germanium.

16. The electronic device of claim 13, wherein, in each storage portion, a conductive metal nitride is disposed on and contacts the dielectric.

17. The electronic device of claim 13, wherein the dielectric is a dielectric stack having a plurality of different dielectric materials.

18. An electronic device comprising:
    a substrate including germanium;
    a silicon region disposed on and contacting the substrate, the silicon region covering germanium of the substrate such that the silicon region is uniform in composition and thickness on a monolayer basis;

a dielectric adjacent the silicon region, the dielectric structured as a nanolaminate having a dielectric constant greater than that of silicon dioxide.

19. The electronic device of claim 18, wherein the nanolaminate includes hafnium oxide and zirconium oxide.

20. The electronic device of claim 18, wherein the thickness is set to a level to meet a selected interface state density between the silicon and the germanium.

* * * * *